US009936296B1

(12) United States Patent
Harrell

(10) Patent No.: US 9,936,296 B1
(45) Date of Patent: Apr. 3, 2018

(54) DEVICE, SYSTEM, AND METHOD FOR MULTIMEDIA COMMUNICATIONS

(71) Applicant: Eric Harrell, Dilley, TX (US)

(72) Inventor: Eric Harrell, Dilley, TX (US)

( * ) Notice: Subject to any disclaimer, the term of this patent is extended or adjusted under 35 U.S.C. 154(b) by 0 days.

(21) Appl. No.: 15/700,069

(22) Filed: Sep. 8, 2017

Related U.S. Application Data

(60) Provisional application No. 62/402,989, filed on Sep. 30, 2016.

(51) Int. Cl.

| | |
|---|---|
| ***H04R 1/10*** | (2006.01) |
| ***H04R 5/033*** | (2006.01) |
| ***H01L 27/32*** | (2006.01) |

(52) U.S. Cl.

CPC ........... *H04R 5/0335* (2013.01); *H01L 27/32* (2013.01); *H04R 1/105* (2013.01); *H04R 1/1025* (2013.01)

(58) Field of Classification Search

CPC .... H04R 5/0335; H04R 5/033; H04R 1/1025; H04R 1/105; H01L 27/32

USPC ........................................................... 381/74

See application file for complete search history.

(56) References Cited

U.S. PATENT DOCUMENTS

| | | | | |
|---|---|---|---|---|
| 9,167,348 | B1 | 10/2015 | Vartanian | |
| 2009/0154739 | A1 | 6/2009 | Zellner | |
| 2009/0318085 | A1 | 12/2009 | Seshadri | |
| 2010/0245585 | A1 | 9/2010 | Fisher | |
| 2010/0311390 | A9 | 12/2010 | Black | |
| 2014/0036127 | A1 * | 2/2014 | Pong ...................... | H04R 1/028 348/333.01 |

* cited by examiner

*Primary Examiner* — Paul S Kim

(74) *Attorney, Agent, or Firm* — Integrity Patent Group, PLC; Edwin Wold

(57) ABSTRACT

A device for multimedia communications is disclosed herein. The device for multimedia communications includes a power supply, a stereo communication link, a left headset earpiece, and a right headset earpiece. The stereo communication link is configured to communicate at least one of audio signals and video signals over a left channel to the left headset earpiece and over a right channel to the right headset earpiece. The left and the right headset earpieces feature speakers and displays for playing audio and video signals together or independently.

19 Claims, 5 Drawing Sheets

DEVICE, SYSTEM, AND METHOD FOR MULTIMEDIA COMMUNICATIONS

CROSS-REFERENCE TO RELATED APPLICATION(S)

The present application is related to and claims priority to U.S. Provisional Patent Application No. 62/402,989 filed Sep. 30, 2016, which is incorporated by reference herein in its entirety.

BACKGROUND OF THE INVENTION

The following includes information that may be useful in understanding the present disclosure. It is not an admission that any of the information provided herein is prior art nor material to the presently described or claimed inventions, nor that any publication or document that is specifically or implicitly referenced is prior art.

TECHNICAL FIELD

The present invention relates generally to the field of telecommunications platforms of existing art and more specifically relates to a device, system, and method for multimedia communications.

RELATED ART

A headset can combine a headphone with a microphone into one device. Headsets are generally constructed with either a single-earpiece or a double-earpiece (mono to both ears or stereo). Headsets provide the equivalent functionality of a telephone handset but with hands-free operation. They have many uses including in call centers and other telephone-intensive jobs and for anybody wishing to have both hands free during a telephone conversation.

Headsets are available in single-earpiece and double-earpiece designs. Single-earpiece headsets are known as monaural headsets. Double-earpiece headsets may support stereo sound, or use the same audio channel for both ear-pieces. Monaural headsets free up one ear, allowing interaction with others and awareness of surroundings. Telephone headsets are monaural, even for double-earpiece designs, because telephone offers only single-channel input and output. For computer or other audio applications, where the sources offer two-channel output, stereo headsets are the norm; use of a headset instead of headphones allows use for communications (usually monaural) in addition to listening to stereo sources.

Headphones are designed to allow a single user to listen to an audio source privately, in contrast to a loudspeaker, which emits sound into the open air, for anyone nearby to hear. A common limitation of current headphones is that the user is only able to access one audio input signal at a time with limited control over listening preferences and display capabilities. There is still a need for an audio headphone device to provide for increased control and enhanced listening possibilities. This is especially relevant in today's market with ever expanding technological capabilities and customization options.

U.S. Pub. No. 2009/0318085 to Nambirajan Seshadri relates to an earpiece/microphone (headset) servicing multiple incoming audio streams. The described earpiece/microphone (headset) servicing multiple incoming audio streams includes a modular wireless headset with which to service multiple incoming audio streams. This modular wireless headset includes a wireless microphone and wireless earpiece. The wireless earpiece may exchange radio frequency (RF) signals with a base unit and render content contained within the exchanged RF signals to a user. This wireless earpiece further includes a wireless interface, a processor, a speaker, a user interface, and an authentication module. The wireless interface allows the earpiece to wirelessly communicate with the base unit. The processor recovers communications exchanged with the base unit that the speaker then renders audible. A user interface coupled to the processor may alert the user to any additional incoming audio communications. Having received the alert, the user may select between the communications. The authentication module allows the wireless earpiece and microphone to pair (forming the modular wireless headset) and register the headset with the base unit.

SUMMARY OF THE INVENTION

In view of the foregoing disadvantages inherent in the known telecommunications platforms art, the present disclosure provides a novel device, system, and method for multimedia communications. The general purpose of the present disclosure, which will be described subsequently in greater detail, is to provide a wireless communications device with a digital display and enhanced user controls.

A device for multimedia communications is disclosed herein. The device for multimedia communications may include a power supply, a stereo communication link, a left headset earpiece, and a right headset earpiece. The stereo communication link may be configured to communicate at least one of audio signals and video signals over a left channel to the left headset earpiece and over a right channel to the right headset earpiece. The left and the right headset earpieces may feature speakers and displays for playing audio and video signals together or independently.

A system for playing multimedia is also disclosed herein. The system for playing multimedia may include a multimedia communications device including a power supply, a stereo communication link, a left headset earpiece, a right headset earpiece, and a controller including a user interface, the controller further configured as a telephony device. The controller may be configured to communicate audio and video signals to the multimedia communications device.

According to another embodiment, a method for playing multimedia is also disclosed herein. The method for playing multimedia may include providing a multimedia communications device such as discussed above, providing a controller, such as discussed above, including a user interface, communicably coupling the multimedia communications device with the controller, communicating audio signals and video signals from the controller to the multimedia communications device, playing left audio signals on the left headset earpiece, playing left video signals on the left display, playing right audio signals on the right headset earpiece, the right audio signals independent of the left audio signals, playing right video signals on the right display, the right video signals independent of the left video signals, and conducting a phone call via the to the multimedia communications device.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate embodiments and methods of use for the present disclosure, a device, system, and method for multimedia communications, constructed and operative according to the teachings of the present disclosure.

The various embodiments of the present invention will hereinafter be described in conjunction with the appended drawings, wherein like designations denote like elements.

DETAILED DESCRIPTION

As discussed above, embodiments of the present disclosure relate to a telecommunications platform and more particularly to a device, system, and method for multimedia communications as used to improve wireless communications devices by providing a digital display, independent operations, and enhanced user controls.

Generally, aspects of this disclosure are directed toward a short range radio protocol sound device (e.g., Bluetooth). The device may be a combination of a listening device with the inclusion of a digital display that may include software controls to enhance the listening possibilities. In one embodiment, it is primarily a device that is put over the ear but can be removed to watch the display if desired. It may be used to listen to music normally as a stereo or one may possibly enable each earpiece to have separate audio sources and graphic sources.

The device may feature a microphone on each earpiece to enable more than one person to join in the conversation. For example, one user can be listening to an audiobook with the right earpiece and then give the left earpiece to a companion to listen to the same audio input or another source on your smartphone device. The sources may be easily configured through a custom interface on the smartphone device through a convenient mobile application. The mobile application may also allow the user to choose customized graphics that can be displayed on the outer surface of each earpiece as well. Audio selections (including phone conversations, audiobooks, stored music, streaming radio services) can be routed to each earpiece uniquely through sources you may set up in the software.

Figure 1:
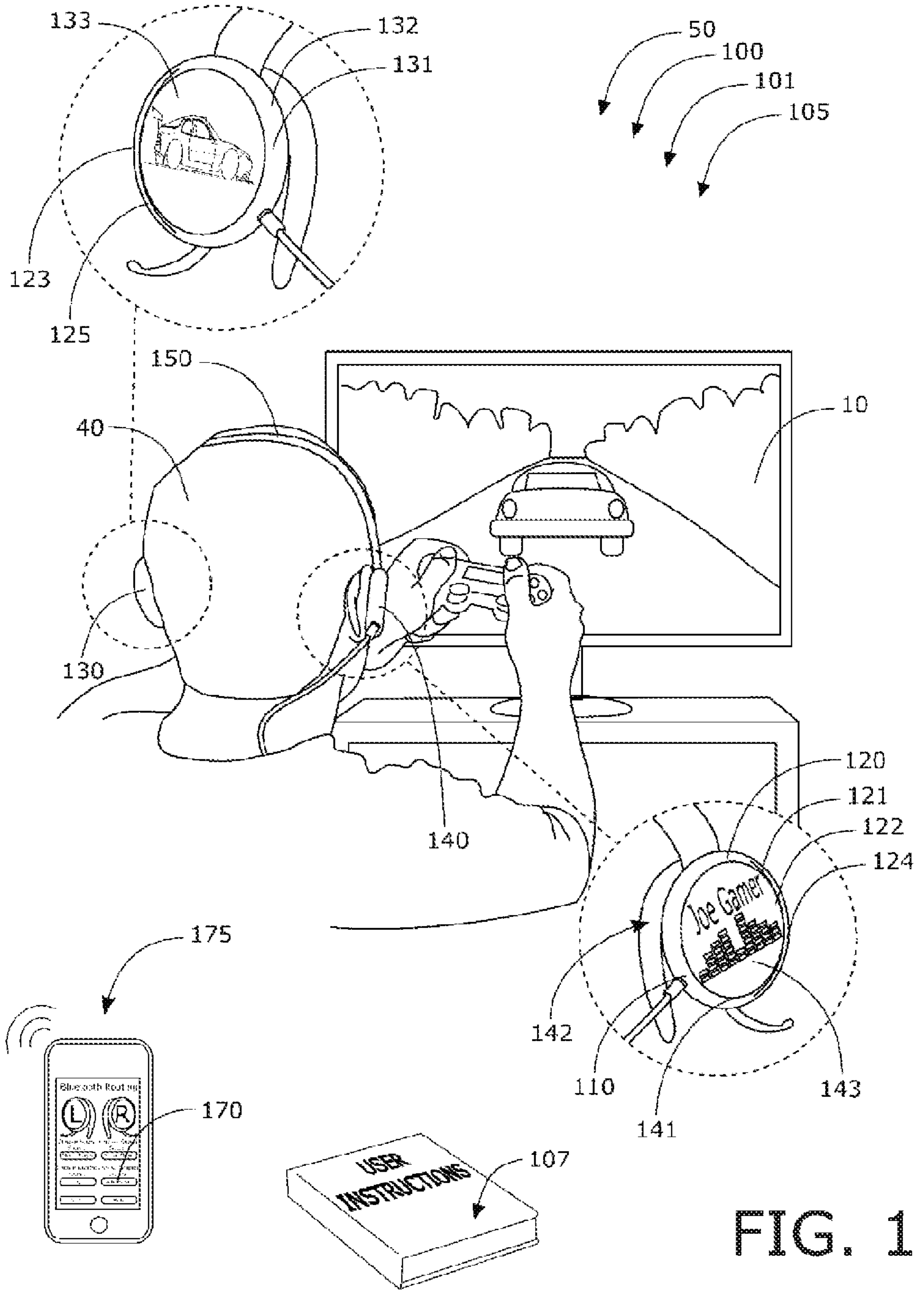
FIG. 1 is a perspective view of a device for multimedia communications during an 'in-use' condition, according to an embodiment of the disclosure.

Referring now more specifically to the drawings by numerals of reference, there is shown in FIGS. 1-4, various views of a device for multimedia communications. FIG. 1 shows the device 100 for multimedia communications ("multimedia communications device") during an 'in-use' condition 50, according to an embodiment of the present disclosure. As shown, the multimedia communications device 100 may be beneficial for use by a user 40 to play multimedia and communicate via a system having independent channels and enhanced controls.

As illustrated, the multimedia communications device 100 may include a power supply 110, a stereo communication link 120, a left headset earpiece 130, and a right headset earpiece 140. As here, one or both of the power supply 110 and the stereo communication link 120 may be embedded in or otherwise housed by either or both of the left headset earpiece 130 and the right headset earpiece 140. The left headset earpiece 130 may be configured to attach to a left ear, and the right headset earpiece 140 may be configured to attach to a right ear. The device 100 may further include a head mount 150, the head mount 150 being removably coupled to the left headset earpiece 130 and to the right headset earpiece 140.

According to one embodiment of the disclosure, the multimedia communications device 100 may be included in a system 101 for playing multimedia. The system 101 may further include a controller 175 that is configured to communicate at least one of audio signals and video signals to the multimedia communications device 100. The controller 175 may include a user interface 170, for example a plurality of tactile features (e.g., button), a touch pad, etc., which may be configure to operate one or more functions of the multimedia communications device 100. According to one embodiment, the controller 175 may be a telephony device, or otherwise configured to communicate with another remote communication device. In a preferred embodiment, the controller 175 may be embodied as or operable from a mobile communication device, such as a cell phone, smart phone, or the like.

According to one embodiment, the multimedia communications device 100 may be arranged as a kit 105. In particular, the device 100 for multimedia communications may further include a set of instructions 107. The instructions 107 may detail functional relationships in relation to the structure of the multimedia communications device 100 such that the multimedia communications device 100 can be used, maintained, or the like, in a preferred manner.

Figure 2:
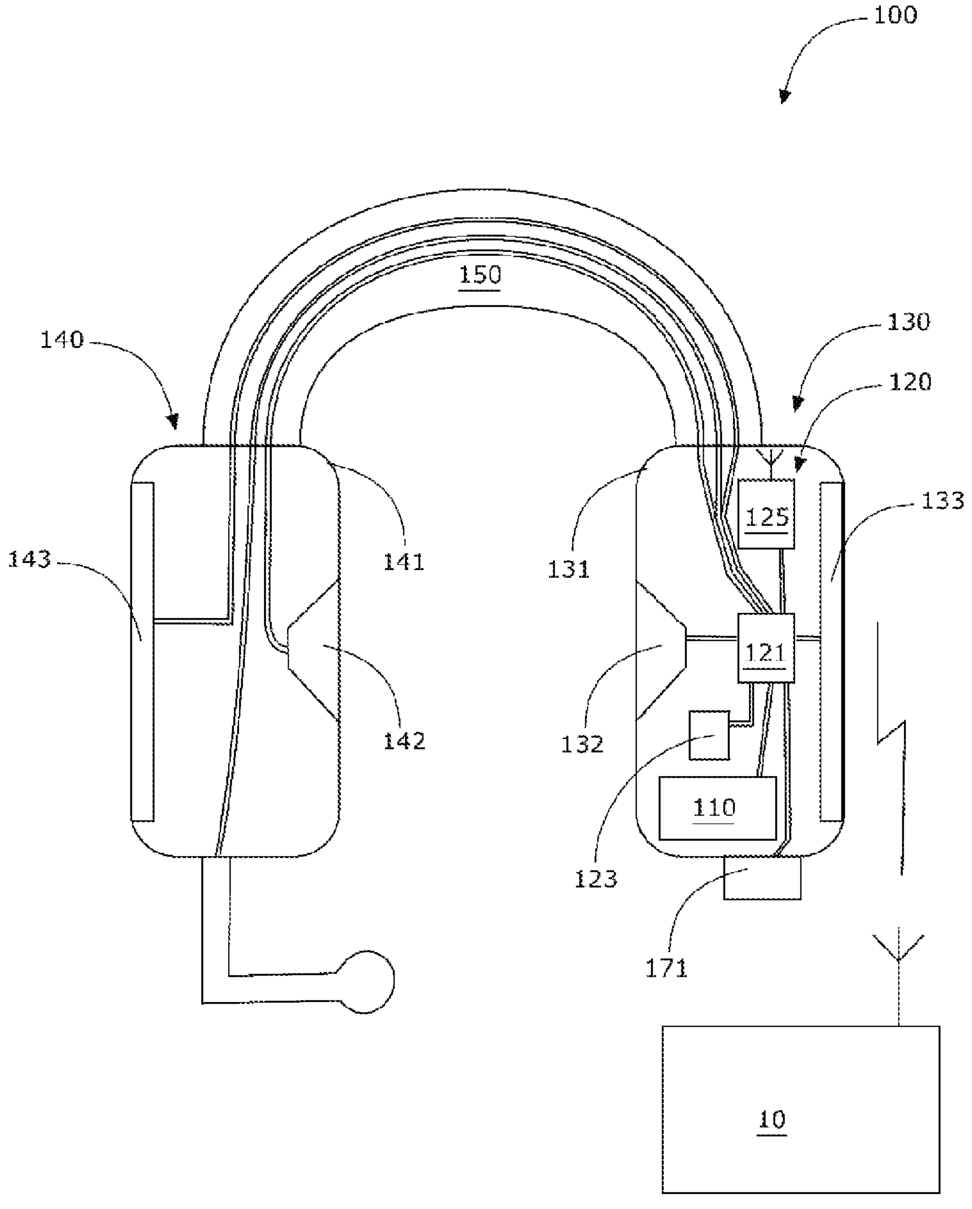
FIG. 2 is a schematic diagram of the device for multimedia communications of FIG. 1, according to an embodiment of the present disclosure.

FIG. 2 is a schematic diagram of portions of the device for multimedia communications of FIG. 1, according to an embodiment of the present disclosure. As above, the multimedia communications device 100 may include the power supply 110, the stereo communication link 120, the left headset earpiece 130, and the right headset earpiece 140, and may further include the head mount 150.

As above, the stereo communication link 120 may be configured to communicate at least one of audio signals and video signals over a left channel and over a right channel. Each channel may include wired portions, wireless portions, or a combination thereof. As shown here, according to one embodiment, the stereo communication link 120 may include a wireless transceiver 125 configured to receive the audio signals and video signals from a signal source 10 (e.g., computer, tablet, media player, smart TV, video game, mobile phone, digital radio, to name a few) that is physically decoupled from the multimedia communications device 100.

The left headset earpiece 130 may include a left housing 131, a left speaker 132 affixed to the left housing 131, the left speaker 132 configured to play audio responsive to the audio signals communicated over the left channel, and a left display 133 affixed to the left housing 131, the left display 133 configured to play video responsive to the video signals communicated over the left channel.

The right headset earpiece 140 may include a right housing 141, a right speaker 142 affixed to the right housing 141, the right speaker 142 configured to play audio responsive to the audio signals communicated over the right channel, and a right display 143 affixed to the right housing 141, the right display 143 configured to play video responsive to the video signals communicated over the right channel.

The multimedia communications device 100 may further include a processor 121 and a memory 123, and a local user interface 171. The processor 121 may be configured to perform various functions such as process and segregate signaling to and from the left headset earpiece 130 and the right headset earpiece 140, and distribute power from the power supply 110. The processor 121 may also be configured to drive the left speaker 132, the left display 133, the right speaker 142, and the right display 143. The memory 123 may be communicably coupled to the processor 121 and configured to store operation/control information and/or content to be played over the left headset earpiece 130 and the right headset earpiece 140. The local user interface may include a plurality of tactile features (e.g., button), a touch pad, etc., which may be configure to operate one or more functions of the multimedia communications device 100. According to one embodiment, each of the left headset earpiece 130 and the right headset earpiece 140 may be independently powered and controlled According to one embodiment, the multimedia communications device 100 may further include may further include a microphone 155 configured to communicate a microphone signal. For example, the a microphone 155 may be coupled to the right headset earpiece 140, for example, and further configured to communicate the microphone signal over at least one of the left channel (and over the right channel. The microphone 155 may further be configured to manually transition between a stowed position and a deployed position.

Figure 3:
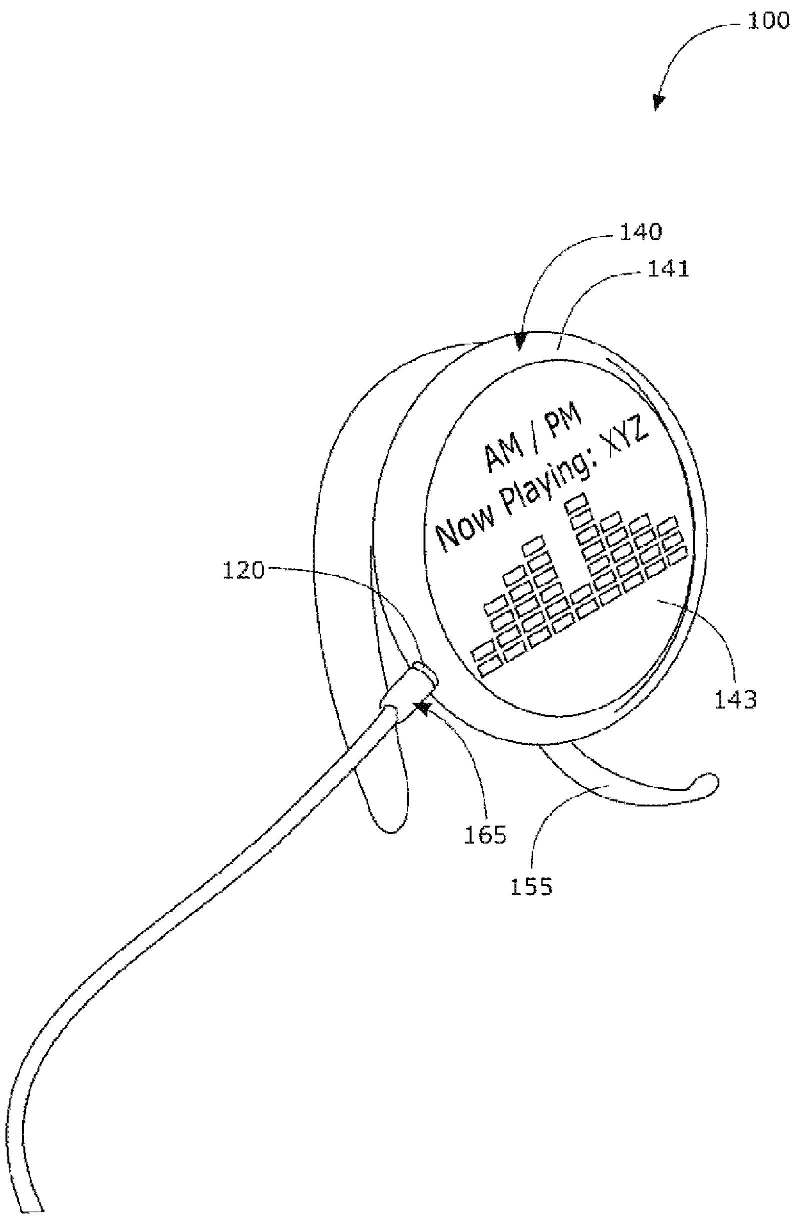
FIG. 3 is a detail view of the device for multimedia communications of FIG. 1, according to an embodiment of the present disclosure.

FIG. 3 is a detail view of the device 100 for multimedia communications of FIG. 1, according to an embodiment of the present disclosure. Shown here is the right headset earpiece 140, which may include the stereo communication link 120 (shown as a wired connection), the right housing 141, the right speaker 142 (FIG. 2) affixed to the right housing 141, and the right display 143 affixed to the right housing 141. The right headset earpiece 140 may also include the microphone 155 configured to communicate a microphone signal, wherein the microphone 155 may further fixed in the deployed position.

According to one embodiment, the multimedia communication device 100 may be configured for a wired connector 165. As shown, the wired connector 165 may be communicably coupled to the stereo communication link 120. According to one embodiment, the wired connector 165 may include a standardized and/or powered connector, such as a USB connection, configured to transfer data and power to the device 100.

Figure 4:
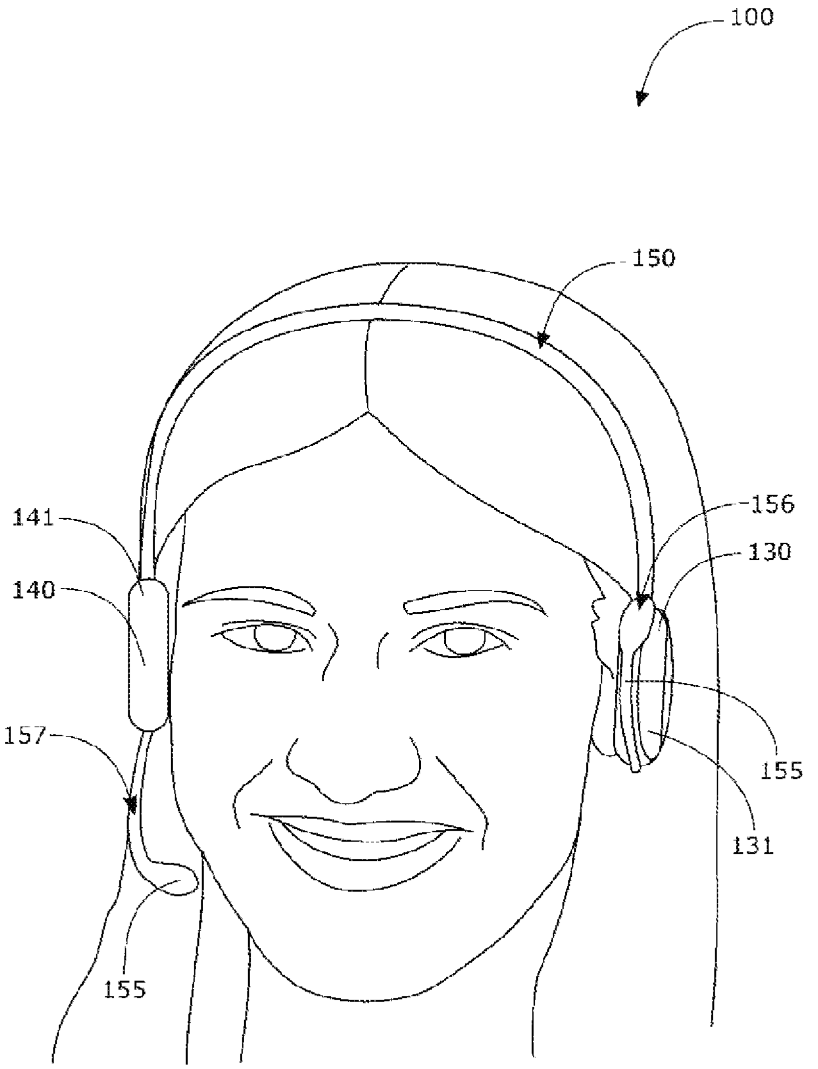
FIG. 4 is a front view of the device for multimedia communications of FIG. 1, according to an embodiment of the present disclosure.

FIG. 4 is a front view of the device 100 for multimedia communications of FIG. 1, according to an embodiment of the present disclosure. Here, the device 100 may include a left headset earpiece 130 configured to attach to a left ear, a right headset earpiece 140 configured to attach to a right ear, and a head mount 150 removably coupled to the left headset earpiece 130 and to the right headset earpiece 140. The left headset earpiece 130 may include left housing 131 and a microphone 155 positioned in a stowed position 156. The right headset earpiece 140 may include right housing 141 and a microphone 155 positioned in a deployed position 157.

Figure 5:
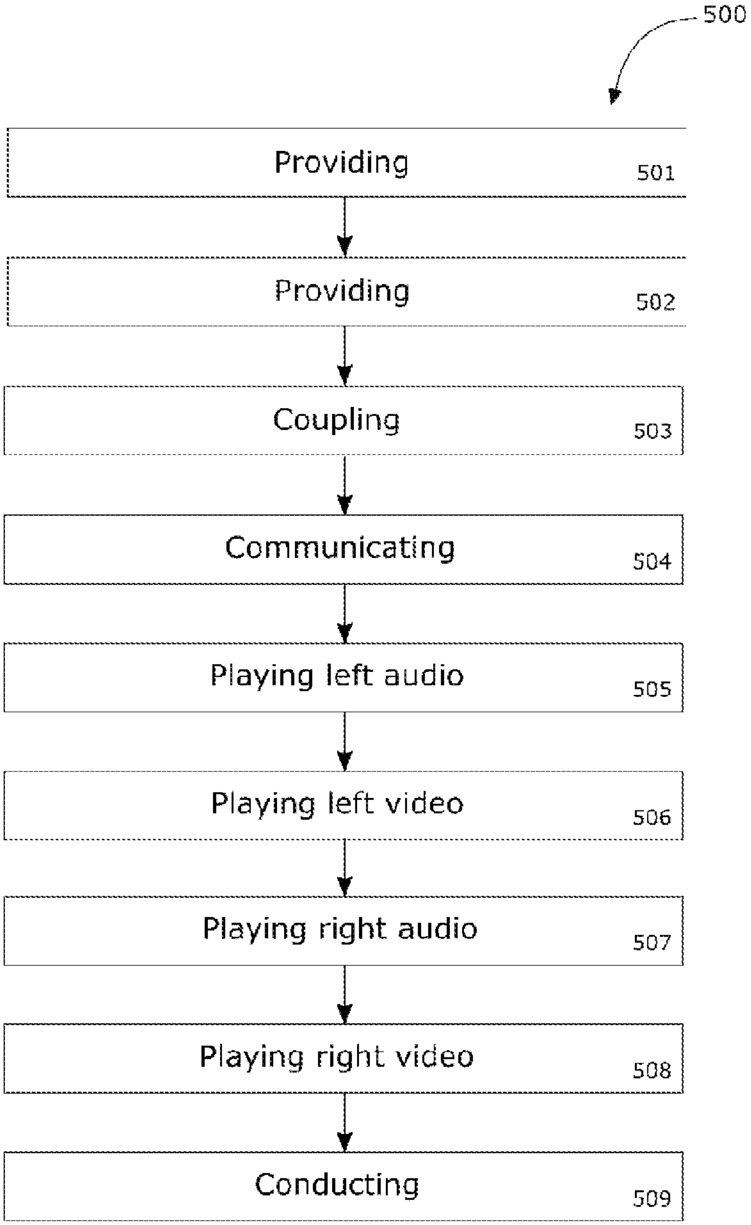
FIG. 5 is a flow diagram illustrating a method for playing multimedia, according to an embodiment of the present disclosure.

FIG. 5 is a flow diagram illustrating a method 500 for playing multimedia, according to an embodiment of the present disclosure. In particular, the method 500 for playing multimedia may include one or more components or features of the device 100 for multimedia communications as described above. As illustrated, the method 500 for playing multimedia may include the steps of: step one 501, providing a multimedia communications device 100 including a power supply 110, a stereo communication link 120 configured to communicate at least one of audio signals and video signals over a left channel and over a right channel, a left headset earpiece 130 configured to attach to a left ear, the left headset earpiece 130 including a left housing 131, a left speaker 132 affixed to the left housing 131, the left speaker 132 configured to play audio responsive to the audio signals communicated over the left channel, a left display 133 affixed to the left housing 131, the left display 133 configured to play video responsive to the video signals communicated over the left channel, a right headset earpiece 140 configured to attach to a right ear, the right headset earpiece 140 including, a right housing 141, a right speaker 142 affixed to the right housing 141, the right speaker 142 configured to play audio responsive to the audio signals communicated over the right channel, a right display 143 affixed to the right housing 141, the right display 143 configured to play video responsive to the video signals communicated over the right channel; step two 502, providing a controller 175 including a user interface 170, said controller 175 configured to communicate the at least one of audio signals and video signals to the multimedia communications device 100 and further configured as a telephony device; step three 503, communicably coupling the multimedia communications device 100 with the controller 175; step four 504, communicating audio signals and video signals from the controller 175 to the multimedia communications device 100; step five 505, playing left audio signals on the left headset earpiece 130; step six 506, playing left video signals on the left display 133; step seven 507, playing right audio signals on the right headset earpiece 140, the right audio signals independent of the left audio signals; step eight 508, playing right video signals on the right display 143, the right video signals independent of the left video signals; and step nine 509, conducting a phone call via the to the multimedia communications device 100.

It should be noted that the steps described in the method of use can be carried out in many different orders according to user preference. The use of "step of" should not be interpreted as "step for", in the claims herein and is not intended to invoke the provisions of 35 U.S.C. §112(f). It should also be noted that, under appropriate circumstances, considering such issues as design preference, user preferences, marketing preferences, cost, structural requirements, available materials, technological advances, etc., other methods for the device 100 for multimedia communications are taught herein.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

What is claimed is new and desired to be protected by Letters Patent is set forth in the appended claims:

1. A device for multimedia communications, the device comprising:

a power supply;

a stereo communication link configured to communicate at least one of audio signals and video signals over a left channel and over a right channel;

a left headset earpiece configured to attach to a left ear, the left headset earpiece including a left housing, a left speaker affixed to the left housing, the left speaker configured to play audio responsive to the audio signals communicated over the left channel, a left display affixed to the left housing, the left display configured to play video responsive to the video signals communicated over the left channel;

a right headset earpiece configured to attach to a right ear, the right headset earpiece including a right housing, a right speaker affixed to the right housing, the right speaker configured to play audio responsive to the audio signals communicated over the right channel, a right display affixed to the right housing, the right display configured to play video responsive to the video signals communicated over the right channel.

2. The device of claim 1, further comprising a head mount, said head mount being removably coupled to the left headset earpiece and to the right headset earpiece.

3. The device of claim 1, further comprising a microphone configured to communicate a microphone signal over the left channel and over the right channel.

4. The device of claim 3, wherein the microphone is further configured to manually transition between a stowed position and a deployed position.

5. The device of claim 1, wherein the stereo communication link includes a wireless portion configured to wirelessly communicate the at least one of audio signals and video signals over the left channel and over the right channel to at least one of the left headset earpiece and the right headset earpiece.

6. The device of claim 1, further comprising a wired connector communicably coupled to the stereo communication link, said wired connector including a USB connection configured to transfer data and power to the device.

7. The device of claim 1, further comprising a user interface configured to operate the device.

8. The device of claim 7, wherein the user interface is voice operated.

9. The device of claim 7, wherein the user interface is physically decoupled from the left headset earpiece and the right headset earpiece.

10. The device of claim 7, wherein the user interface is further configured to operate the left headset earpiece and the right headset earpiece independently of each other and to play independent audio and video content in each of the left headset earpiece and the right headset earpiece.

11. The device of claim 1, wherein the left headset earpiece and the right headset earpiece are each configured to switch between communicating audio signals and video signals.

12. The device of claim 1, wherein the stereo communications link includes a wireless transceiver configured to receive the at least one of the audio signals and the video signals from a signal source physically decoupled from the device.

13. The device of claim 12, wherein the wireless transceiver is configured to make a Bluetooth connection.

14. The device of claim 1, wherein the left display and right display are each configured to exhibit both still and video images.

15. The device of claim 1, further comprising:

a head mount, said head mount being removably coupled to the left headset earpiece and to the right headset earpiece;

a microphone configured to communicate a microphone signal over the left channel and over the right channel;

a wired connector communicably coupled to the stereo communication link, said wired connector including a USB connection configured to transfer data and power to the device; and a user interface configured to operate the device; and wherein the microphone is further configured to manually transition between a stowed position and a deployed position;

wherein the stereo communication link includes a wireless portion configured to wirelessly communicate the at least one of audio signals and video signals over the left channel and over the right channel to at least one of the left headset earpiece and the right headset earpiece;

wherein the user interface is voice operated;

wherein the user interface is physically decoupled from the left headset earpiece and the right headset earpiece;

wherein the user interface is further configured to operate the left headset earpiece and the right headset earpiece independently of each other and to play independent audio and video content in each of left headset earpiece and the right headset earpiece;

wherein the left headset earpiece and the right headset earpiece are each configured to switch between communicating audio signals and video signals;

wherein the stereo communications link includes a wireless transceiver configured to receive the at least one of the audio signals and the video signals from a signal source physically decoupled from the device;

wherein the wireless transceiver is configured to make a Bluetooth connection; and wherein the left display and right display are each configured to exhibit both still and video images.

16. The device of claim 15, further comprising set of instructions; and wherein the device is arranged as a kit.

17. A system for playing multimedia, the system comprising:

a multimedia communications device including a power supply, a stereo communication link configured to communicate at least one of audio signals and video signals over a left channel and over a right channel, a left headset earpiece configured to attach to a left ear, the left headset earpiece including a left housing, a left speaker affixed to the left housing, the left speaker configured to play audio responsive to the audio signals communicated over the left channel, a left display affixed to the left housing, the left display configured to play video responsive to the video signals communicated over the left channel, a right headset earpiece configured to attach to a right ear, the right headset earpiece including, a right housing, a right speaker affixed to the right housing, the right speaker configured to play audio responsive to the audio signals communicated over the right channel, a right display affixed to the right housing, the right display configured to play video responsive to the video signals communicated over the right channel; and a controller including a user interface, said controller configured to communicate the at least one of audio signals and video signals to the multimedia communications device and further configured as a telephony device.

18. The system of claim 17, wherein the controller is a mobile communication device.

19. A method for playing multimedia, the method comprising the steps of:

providing a multimedia communications device including a power supply, a stereo communication link configured to communicate at least one of audio signals and video signals over a left channel and over a right channel, a left headset earpiece configured to attach to a left ear, the left headset earpiece including a left housing, a left speaker affixed to the left housing, the left speaker configured to play audio responsive to the audio signals communicated over the left channel, a left display affixed to the left housing, the left display configured to play video responsive to the video signals communicated over the left channel, a right headset earpiece configured to attach to a right ear, the right headset earpiece including, a right housing, a right speaker affixed to the right housing, the right speaker configured to play audio responsive to the audio signals communicated over the right channel, a right display affixed to the right housing, the right display configured to play video responsive to the video signals communicated over the right channel;

providing a controller including a user interface, said controller configured to communicate the at least one of audio signals and video signals to the multimedia communications device and further configured as a telephony device;

communicably coupling the multimedia communications device with the controller; and communicating audio signals and video signals from the controller to the multimedia communications device;

playing left audio signals on the left headset earpiece;

playing left video signals on the left display;

playing right audio signals on the right headset earpiece, the right audio signals independent of the left audio signals;

playing right video signals on the right display, the right video signals independent of the left video signals; and conducting a phone call via the to the multimedia communications device.

* * * * *